US00RE47707E

(19) United States
(12) Reissued Patent
Kato et al.

(10) Patent Number: US RE47,707 E
(45) Date of Reissued Patent: Nov. 5, 2019

(54) CHARGED PARTICLE BEAM WRITING APPARATUS AND CHARGED PARTICLE BEAM WRITING METHOD

(71) Applicant: NuFlare Technology, Inc., Yokohama-shi (JP)

(72) Inventors: Yasuo Kato, Yokohama (JP); Jun Yashima, Yokohama (JP); Akihito Anpo, Machida (JP)

(73) Assignee: NuFlare Technology, Inc., Yokohama-shi (JP)

(21) Appl. No.: 15/289,706

(22) Filed: Oct. 10, 2016

Related U.S. Patent Documents

Reissue of:
(64) Patent No.: 8,872,141
Issued: Oct. 28, 2014
Appl. No.: 13/765,140
Filed: Feb. 12, 2013

(30) Foreign Application Priority Data

Mar. 27, 2012 (JP) ..... 2012-072473

(51) Int. Cl.
*G21K 5/04* (2006.01)
*H01J 37/302* (2006.01)
(Continued)

(52) U.S. Cl.
CPC ..... *H01J 37/3026* (2013.01); *B82Y 10/00* (2013.01); *B82Y 40/00* (2013.01); *H01J 37/3174* (2013.01);
(Continued)

(58) Field of Classification Search
CPC ..... H01J 37/3026; H01J 37/3174; H01J 2237/31769; H01J 2237/31776; H01J 2237/31761
See application file for complete search history.

(56) References Cited

U.S. PATENT DOCUMENTS 5,863,682 A 1/1999 Abe et al.
7,375,356 B2 5/2008 Kurokawa
(Continued)

FOREIGN PATENT DOCUMENTS

JP 9-289164 11/1997
JP 3469422 9/2003
(Continued)

OTHER PUBLICATIONS

Office Action issued in Korean Patent Application No. 10-2013-0028576, (with English-language Translation).

*Primary Examiner* — James A Menefee
(74) *Attorney, Agent, or Firm* — Oblon, McClelland, Maier & Neustadt, L.L.P.

(57) ABSTRACT

A apparatus according to an embodiment includes a unit to generate first blocks in a writing region in which at least one of writing groups respectively using different base doses is to be written, a unit to generate second blocks for proximity effect correction, in the each of the regions of the groups, a unit to calculate an area density in each of the first blocks, a unit to perform a weighting calculation on the area density for each of the first blocks by using a base dose of a corresponding group, a unit to calculate a dose coefficient for proximity effect correction, for each of the second blocks, by using a corresponding weighted area density, and a unit to calculate a dose by using the base dose of the each of the groups and the dose coefficient of the each of the second blocks.

21 Claims, 10 Drawing Sheets

(51) Int. Cl.
*B82Y 40/00* (2011.01)
*B82Y 10/00* (2011.01)
*H01J 37/317* (2006.01)

(52) U.S. Cl.
CPC ..... *H01J 2237/31769* (2013.01); *H01J 2237/31776* (2013.01)

(56) References Cited

U.S. PATENT DOCUMENTS

| | | | |
|---|---|---|---|
| 7,504,645 | B2 | 3/2009 | Anpo et al. |
| 7,592,611 | B2 | 9/2009 | Kasahara et al. |
| 7,601,968 | B2 | 10/2009 | Abe et al. |
| 7,698,682 | B2 | 4/2010 | Anpo et al. |
| 7,740,991 | B2 | 6/2010 | Emi et al. |
| 7,750,324 | B2 | 7/2010 | Oogi et al. |
| 7,949,966 | B2 | 5/2011 | Anpo et al. |
| 8,065,635 | B2 | 11/2011 | Yashima et al. |
| 8,103,980 | B2 | 1/2012 | Emi et al. |
| 8,122,390 | B2 | 2/2012 | Yashima et al. |
| 8,183,545 | B2 | 5/2012 | Yashima |
| 8,188,449 | B2 | 5/2012 | Shibata et al. |
| 8,207,514 | B2 | 6/2012 | Hara et al. |
| 8,307,314 | B2 | 11/2012 | Anpo |
| 8,309,283 | B2 | 11/2012 | Kato et al. |
| 8,352,889 | B2 | 1/2013 | Emi et al. |
| 8,429,575 | B2 | 4/2013 | Yashima et al. |
| 2007/0196768 | A1* | 8/2007 | Ogino ..... 430/296 |
| 2010/0072390 | A1 | 3/2010 | Yashima |
| 2010/0237253 | A1 | 9/2010 | Yashima |
| 2011/0033788 | A1 | 2/2011 | Kato |
| 2011/0066271 | A1 | 3/2011 | Anpo |
| 2011/0066272 | A1 | 3/2011 | Anpo |
| 2011/0253912 | A1 | 10/2011 | Matsumoto |
| 2011/0291029 | A1 | 12/2011 | Yashima |
| 2012/0001097 | A1 | 1/2012 | Yashima et al. |
| 2012/0007002 | A1 | 1/2012 | Nakayamada et al. |
| 2012/0068089 | A1 | 3/2012 | Nakayamada et al. |
| 2012/0104286 | A1 | 5/2012 | Yashima et al. |
| 2012/0126145 | A1 | 5/2012 | Yashima |
| 2012/0211674 | A1 | 8/2012 | Kato |
| 2012/0292536 | A1 | 11/2012 | Yashima et al. |
| 2012/0292537 | A1 | 11/2012 | Yashima et al. |
| 2013/0099139 | A1 | 4/2013 | Kato et al. |

FOREIGN PATENT DOCUMENTS

| | | |
|---|---|---|
| JP | 2003-318077 | 11/2003 |
| JP | 3655622 | 3/2005 |
| JP | 2007-5341 | 1/2007 |
| JP | 2007-150243 | 6/2007 |
| JP | 2007-227564 | 9/2007 |
| JP | 4621076 | 11/2010 |
| JP | 2011-228503 | 11/2011 |

* cited by examiner

FIG. 5A
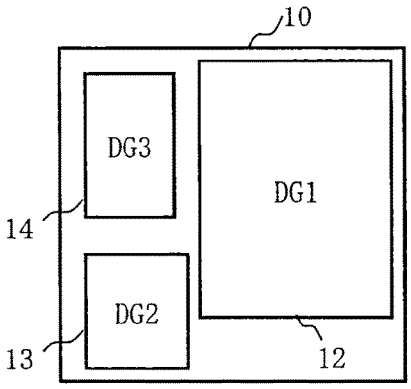
FIG. 5B
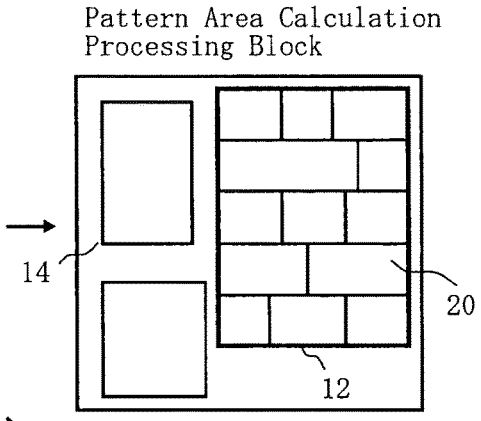
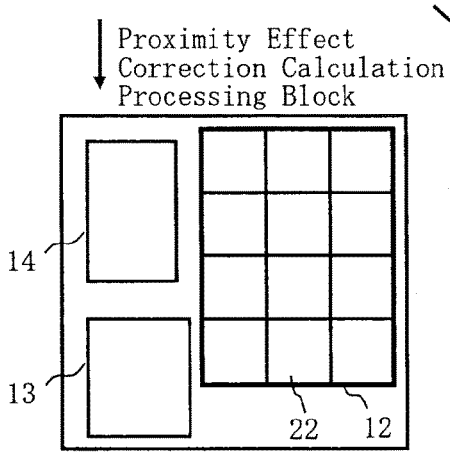
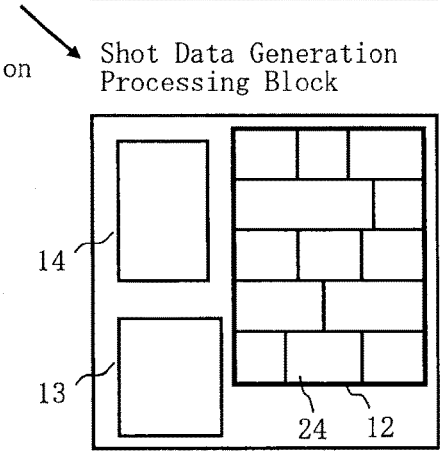
FIG. 5C
FIG. 5D

FIG. 6A
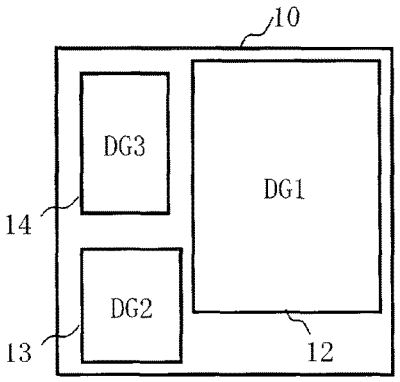
FIG. 6B
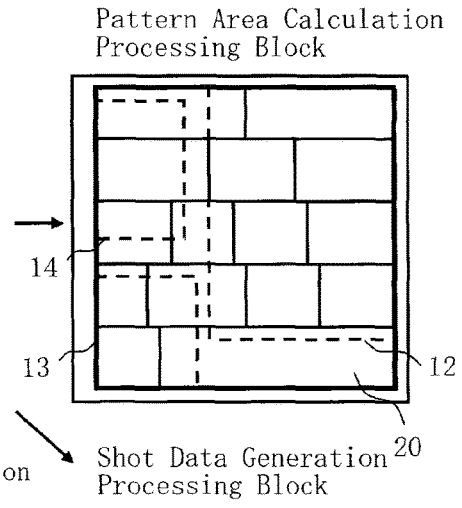
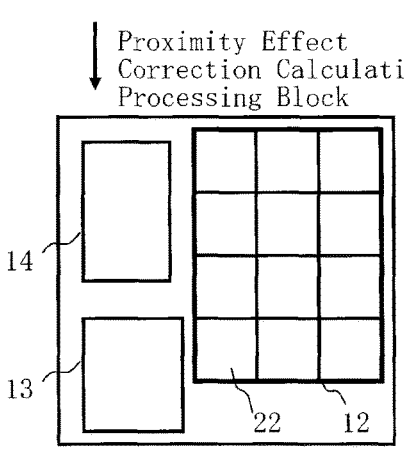
FIG. 6C
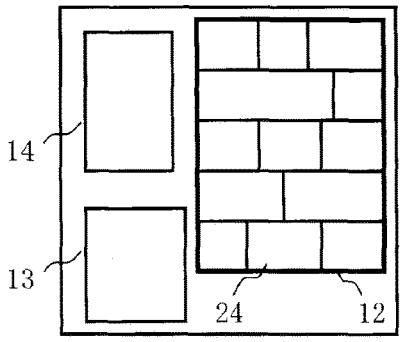
FIG. 6D

CHARGED PARTICLE BEAM WRITING APPARATUS AND CHARGED PARTICLE BEAM WRITING METHOD

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATION

This application is based upon and claims the benefit of priority from the prior Japanese Patent Application No. 2012-072473 filed on Mar. 27, 2012 in Japan, the entire contents of which are incorporated herein by reference.

BACKGROUND OF THE INVENTION

1. Field of the Invention

The present invention relates to a charged particle beam writing apparatus and a charged particle beam writing method. For example, the present invention relates to a method for correcting dimension variation of a pattern due to electron back scattering in electron beam writing.

2. Description of Related Art

The lithography technique that advances microminiaturization of semiconductor devices is extremely important as being a unique process whereby patterns are formed in the semiconductor manufacturing. In recent years, with high integration of LSI, the line width (critical dimension) required for semiconductor device circuits is decreasing year by year. In order to form a desired circuit pattern on semiconductor devices, a master or "original" pattern (also called a mask or a reticle) of high accuracy is needed. Thus, the electron beam (EB) writing technique, which intrinsically has excellent resolution, is used for producing such a highly precise master pattern.

FIG. 10 is a schematic diagram explaining operations of a conventional variable shaped electron beam (EB) writing (or drawing) apparatus. As shown in the figure, the variable shaped electron beam writing apparatus operates as described below. A first aperture plate 410 has a quadrangular opening 411 for shaping an electron beam 330. A second aperture plate 420 has a variable-shape opening 421 for shaping the electron beam 330 having passed through the opening 411 of the first aperture plate 410 into a desired quadrangular shape. The electron beam 330 emitted from a charged particle source 430 and having passed through the opening 411 is deflected by a deflector to pass through a part of the variable-shape opening 421 of the second aperture plate 420, and thereby to irradiate a target object or "sample" 340 placed on a stage which continuously moves in one predetermined direction (e.g. x direction) during the writing. In other words, a quadrangular shape that can pass through both the opening 411 and the variable-shape opening 421 is used for pattern writing in a writing region of the target object 340 on the stage continuously moving in the X direction. This method of forming a given shape by letting beams pass through both the opening 411 of the first aperture plate 410 and the variable-shape opening 421 of the second aperture plate 420 is referred to as a variable shaped beam (VSB) method.

In the electron beam writing, a phenomenon called a proximity effect occurs when electron beams irradiate a circuit pattern on a mask with resist to write or "draw" a pattern. The proximity effect is generated by backward scattering of electron beams penetrating the resist film, reaching the layer thereunder to be reflected, and entering the resist film again. As a result, a dimensional variation occurs, that is, a written pattern is deviated from a desired dimension. Therefore, in the electron beam writing, proximity effect correction that suppresses such dimensional variation by correcting a dose is performed, for example.

In such electron beam writing, there is a case in which a pattern, such as a scattering bar, narrower than other pattern is written with a larger dose than that of other pattern. Moreover, there is a case in which writing conditions (parameters, such as a dose and a proximity effect correction coefficient) of only a certain region is changed in order to resize a pattern in the region by using a dose. Furthermore, there is a case in which writing is to be performed again after changing the writing conditions for a region which has been written once. In the cases described above, it is necessary to perform proximity effect correction respectively for the patterns of different writing conditions.

However, in performing proximity effect correction for a target pattern, if a pattern using writing conditions different from those of the target pattern is arranged near the target pattern, the influence of the pattern of different writing conditions needs to be taken into consideration. Generally, since parameters for proximity effect correction are different from each other between patterns of different writing conditions, it is difficult to apply an existing model proximity effect correction equation to a closely arranged pattern of different writing conditions. Moreover, even if the proximity effect correction is performed using a parameter according to conditions of one pattern in the patterns of different writing conditions, it is difficult to perform proximity effect correction in sufficient accuracy.

Now, there is a proximity effect correction coefficient $\eta$ which is suitable for performing proximity effect correction for each base dose $D_{base}$. Then, a method of calculating a dose for correcting a dimension variation amount due to a loading effect while correcting a proximity effect with changing a combination of the base dose $D_{base}$ and the proximity effect correction coefficient $\eta$ is disclosed (refer to, e.g., Japanese Patent Application Laid-open (JP-A) No. 2007-150243).

BRIEF SUMMARY OF THE INVENTION

In accordance with one aspect of the present invention, a charged particle beam writing apparatus includes a first block generation unit configured to generate a plurality of area processing blocks in a writing region in which at least one of a plurality of writing groups respectively using different base doses, where a plurality of figure patterns are arranged in each of regions of the plurality of writing groups, is to be written, a second block generation unit configured to generate a plurality of proximity effect correction processing blocks for proximity effect correction, in the each of the regions of the plurality of writing groups, an area density calculation unit configured to calculate an area density of a figure pattern arranged in each of the plurality of area processing blocks, a weighting calculation unit configured to perform a weighting calculation on the area density for each of the plurality of area processing blocks by using a base dose of a corresponding group in the plurality of writing groups, a proximity effect correction dose coefficient calculation unit configured to calculate a proximity effect correction dose coefficient for proximity effect correction, for each of the plurality of proximity effect correction processing blocks, by using a corresponding weighted area density, a dose calculation unit configured to calculate a dose of a charged particle beam by using the base dose of the each of the plurality of writing groups and the proximity effect correction dose coefficient of the each of the plurality of proximity effect correction processing blocks, and a writing unit configured to write a figure pattern concerned in the plurality of figure patterns on a target object with a charged particle beam, based on the dose calculated, for the each of the regions of the plurality of writing groups.

In accordance with another aspect of the present invention, a charged particle beam writing method includes generating a plurality of area processing blocks in a writing region in which at least one of a plurality of writing groups respectively using different base doses, where a plurality of figure patterns are arranged in each of regions of the plurality of writing groups, is to be written, generating a plurality of proximity effect correction processing blocks for proximity effect correction, in the each of the regions of the plurality of writing groups, calculating an area density of a figure pattern arranged in each of the plurality of area processing blocks, performing a weighting calculation on the area density for each of the plurality of area processing blocks by using a base dose of a corresponding group in the plurality of writing groups, calculating a proximity effect correction dose coefficient for proximity effect correction, for each of the plurality of proximity effect correction processing blocks, by using a corresponding weighted area density, calculating a dose of a charged particle beam by using the base dose of the each of the plurality of writing groups and the proximity effect correction dose coefficient of the each of the plurality of proximity effect correction processing blocks, and writing a figure pattern concerned in the plurality of figure patterns on a target object with a charged particle beam, based on the dose calculated, for the each of the regions of the plurality of writing groups.

BRIEF DESCRIPTION OF THE DRAWINGS

FIGS. 5A to 5D are schematic diagrams each showing an example of a processing block according to Embodiment 1;

FIGS. 6A to 6D are schematic diagrams each showing an example of a processing block according to Embodiment 2.

DETAILED DESCRIPTION OF THE INVENTION

In the following Embodiments, there will be described a structure in which an electron beam is used as an example of a charged particle beam. The charged particle beam is not limited to the electron beam, and other charged particle beam, such as an ion beam, may also be used. Moreover, a variable-shaped electron beam writing apparatus will be described as an example of a charged particle beam apparatus. In addition, in the equations, etc. described below, x denotes a vector indicating a position.

Moreover, in the following Embodiments, there will be described an apparatus and a method thereof that can perform proximity effect correction, when writing patterns of different writing conditions, while taking the influence of both the patterns into consideration.

Embodiment 1

Figure 1:
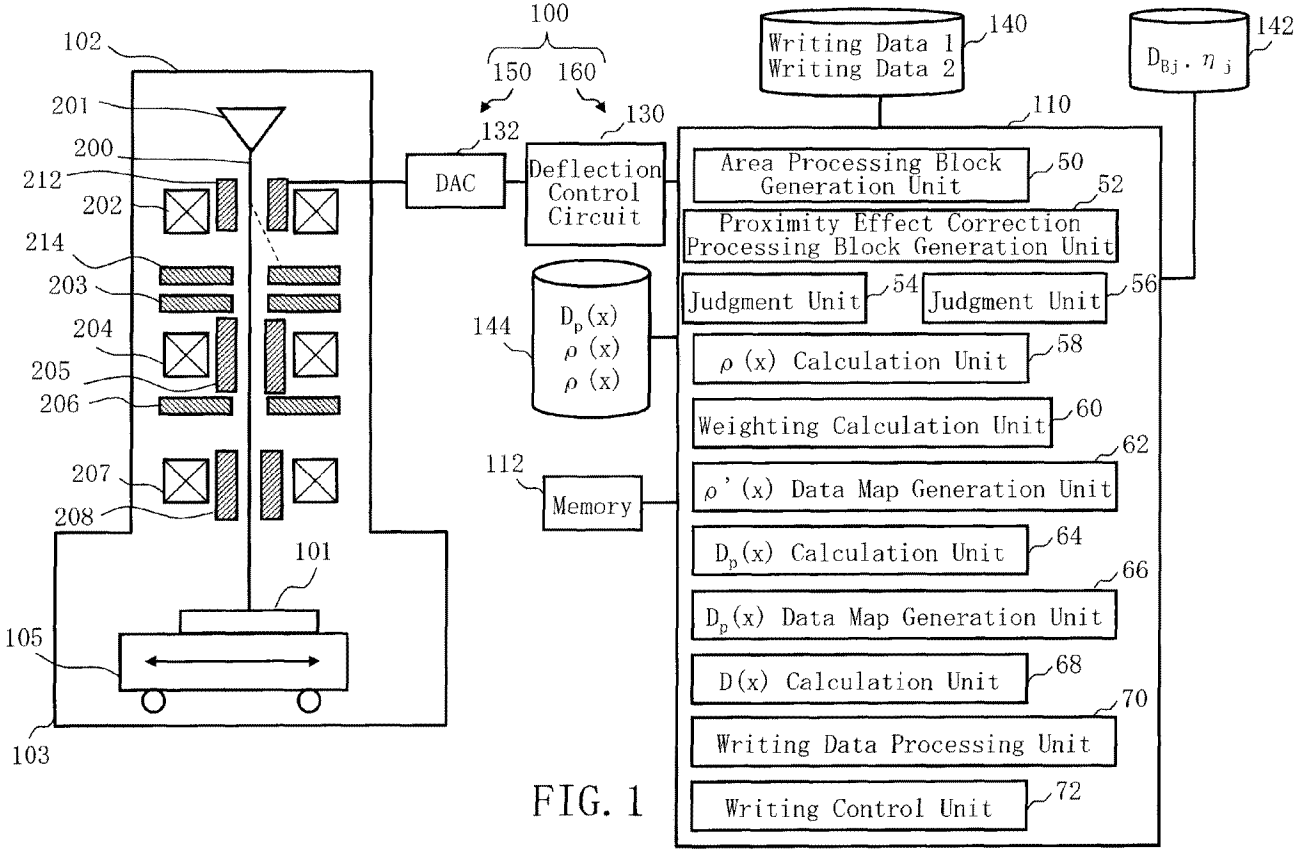
FIG. 1 is a schematic diagram showing a structure of a writing apparatus according to Embodiment 1.

FIG. 1 is a schematic diagram showing a structure of a writing apparatus according to Embodiment 1. In FIG. 1, a writing, or "drawing" apparatus 100 includes a writing unit 150 and a control unit 160. The writing apparatus 100 is an example of a charged particle beam writing apparatus, and especially, an example of a variable-shaped electron beam (VSB) writing apparatus. The writing unit 150 includes an electron lens barrel 102 and a writing chamber 103. In the electron lens barrel 102, there are arranged an electron gun assembly 201, an illumination lens 202, a blanking deflector 212, a blanking aperture 214, a first shaping aperture 203, a projection lens 204, a deflector 205, a second shaping aperture 206, an objective lens 207, and a deflector 208. In the writing chamber 103, there is arranged an XY stage 105 which is movable at least in the x and y directions. On the XY stage 105, a target object 101 on which resist is applied, serving as a writing target, is placed. The target object 101 is, for example, a mask for exposure, a silicon wafer, etc. used for manufacturing semiconductor devices. The mask may be, for example, a mask blank on which a pattern has not yet been formed.

The control unit 160 includes a control computer 110, a memory 112, a deflection control circuit 130, a DAC (digital analog converter) amplifier 132, and storage devices 140, 142 and 144, such as a magnetic disk drive. The control computer 110, the memory 112, the deflection control circuit 130, and the storage devices 140, 142 and 144 are mutually connected through a bus (not shown). The deflection control circuit 130 is connected to the blanking deflector 212 through the DAC amplifier 132.

In the control computer 110, there are arranged an area processing block generation unit 50, a proximity effect correction processing block generation unit 52, judgment units 54 and 56, an area density calculation unit 58, a weighting calculation unit 60, an area density data map generation unit 62, a dose coefficient calculation unit 64 for proximity effect correction, a dose coefficient data map generation unit 66 for proximity effect correction, a dose calculation unit 68, a writing data processing unit 70, and a writing control unit 72. Functions such as these may be implemented by a software program, or configured by hardware, such as an electronic circuit. Alternatively, they may be implemented by a combination of software and hardware. Input data necessary for such functions or a calculated result is stored in the memory 112 each time.

In the storage device 140, there is stored writing data input from the outside and including each figure data wherein a figure code, coordinates of a reference position, and figure dimensions in the x and y directions are defined for each figure. Moreover, in the storage device 140, there is stored a plurality of writing data whose writing conditions, such as a base dose $D_B$, a proximity effect correction coefficient η, etc., are different from each other.

As described above, FIG. 1 shows a structure necessary for explaining Embodiment 1. Other structure elements generally necessary for the writing apparatus 100 may also be included. For example, although the deflector 208 of a single stage deflector is used for deflecting an object in this case, a multiple stage deflector of a plurality of stages may also be used. For example, a two stage deflector of the main deflector and the sub deflector may also be used. Alternatively, it is also acceptable to use a three stage deflector of the first objective deflector, the second objective deflector, and the third objective deflector. The deflection control circuit 130 is connected to the deflectors 205 and 208 through each DAC amplifier (not shown).

Figure 2:
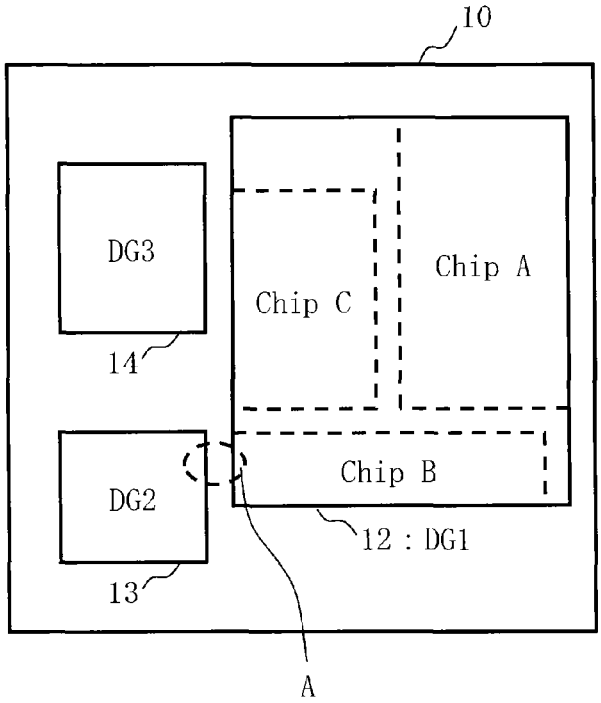
FIG. 2 is a schematic diagram showing an example of writing layout according to Embodiment 1.

FIG. 2 is a schematic diagram showing an example of writing layout according to Embodiment 1. In FIG. 2, patterns of a plurality of writing groups (DG), or "drawing groups" whose writing conditions are different from each other are written in a writing region 10 of the target object 101. FIG. 2 shows the case where three writing groups 12 (DG1), 13 (DG2), and 14 (DG3) are arranged. Chips A, B, and C are written as the writing group 12. Although not illustrated in FIG. 2, at least one chip is arranged in each of the writing groups 13 and 14.

Figure 3A:
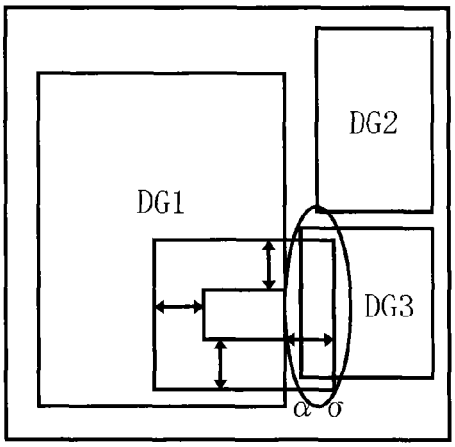
FIGS. 3A and 3B are schematic diagrams showing examples of writing layout according to Embodiment 1.
Figure 3B:
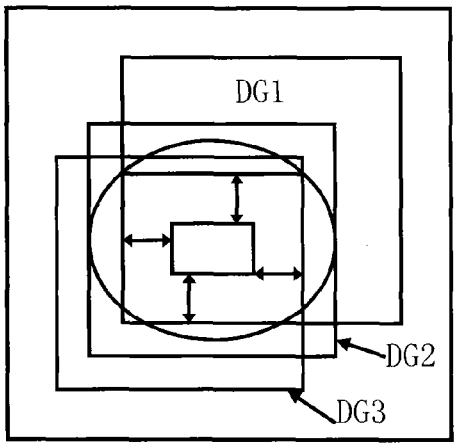

FIGS. 3A and 3B are schematic diagrams showing other examples of the writing layout according to Embodiment 1. As shown in FIG. 3A, it is acceptable to group a pattern such as a scattering bar etc., which is narrower than other patterns, into a writing group differing from the groups of other patterns. Alternatively, it is also acceptable to group only the region where the pattern narrower than other patterns is arranged into a writing group differing from other writing group in order to change the writing conditions (parameters such as a dose, a proximity effect correction coefficient, etc.) of only the region so as to perform resizing based on the dose. Alternatively, as shown in FIG. 3B, if a region which has already been written once needs to be written again while changing its writing conditions, it is acceptable to group the region into different writing groups at the first and second writing.

When performing a proximity effect correction calculation for a certain writing group and if, for example, another writing group is included in the influence range of proximity effect of the certain writing group, the calculation will be affected by a pattern included in that other writing group. For example, when performing a proximity effect correction calculation with respect to the writing group 12, the region A adjacent to the writing group 13 will be affected by a pattern included in the writing group 13. Therefore, according to Embodiment 1, proximity effect correction is performed while taking the influence of a pattern in each writing group within the influence range into consideration.

Figure 4:
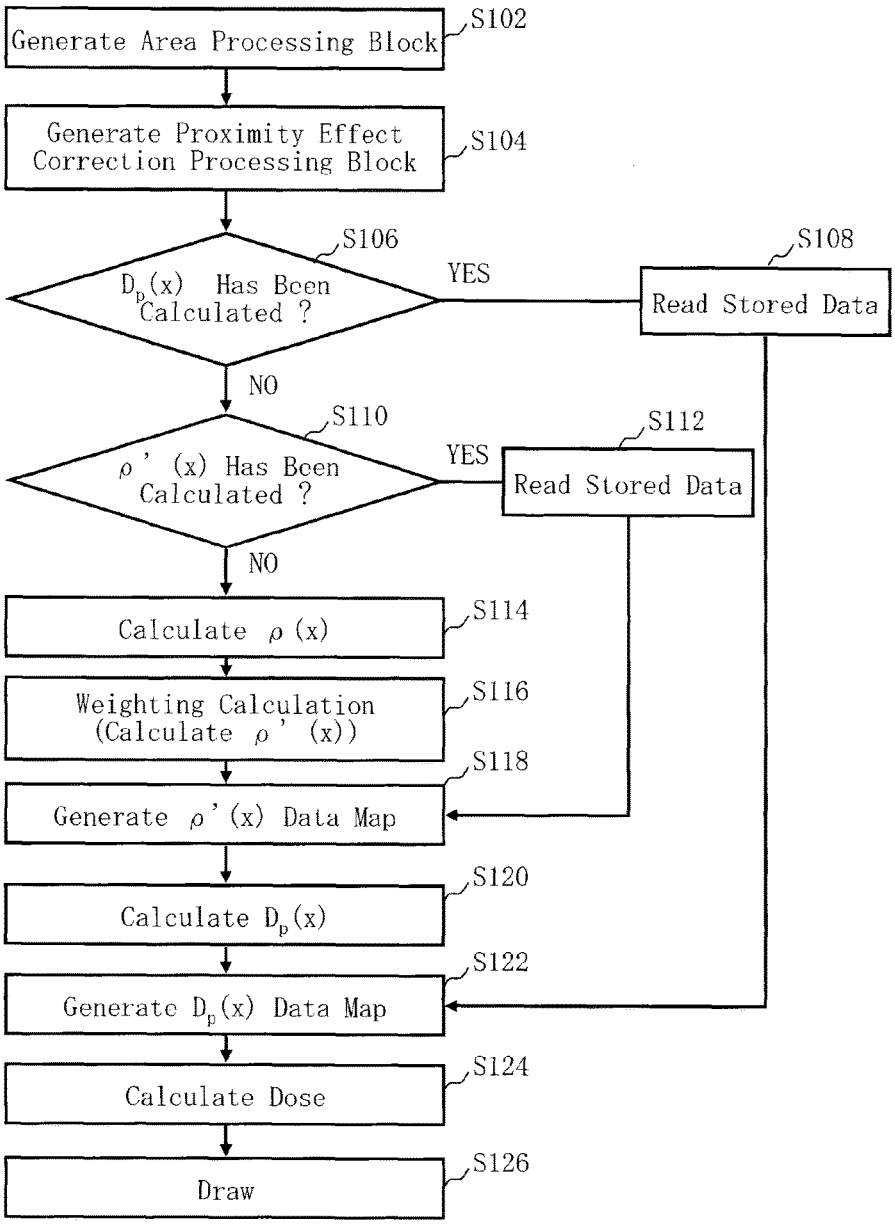
FIG. 4 is a flowchart showing main steps of a writing method according to Embodiment 1.

FIG. 4 is a flowchart showing main steps of a writing method according to Embodiment 1. In FIG. 4, the writing method according to Embodiment 1 executes a series of steps: an area processing block generation step (S102), a proximity effect correction processing block generation step (S104), a judgment step (S106), a stored data read step (S108), a judgment step (S110), a stored data read step (S112), an area density ρ(x) calculation step (S114), a weighting calculation step (S116), an area density ρ'(x) data map generation step (S118), a dose coefficient $D_p(x)$ calculation step (S120) for proximity effect correction, a dose coefficient $D_p(x)$ data map generation step (S122) for proximity effect correction, a dose D(x) calculation step (S124), and a writing step (S126).

In the area processing block generation step (S102), the area processing block generation unit 50 (block generation unit) generates a plurality of area processing blocks in the writing region 10 including each of regions of a plurality of writing groups respectively having different base doses $D_B$ and different proximity effect correction coefficients η, in each of which a plurality of figure patterns are arranged.

FIGS. 5A to 5D are schematic diagrams each showing an example of a processing block according to Embodiment 1. FIG. 5A shows the case, similarly to FIG. 2, where a plurality of writing groups 12, 13, and 14 are arranged (written) in the writing region 10 of the target object 101. According to Embodiment 1, as shown in FIG. 5B, the area processing block generation unit 50 generates a plurality of area processing blocks 20 for performing a pattern area calculation, in each writing group. Although not illustrated, with respect to other writing groups, a plurality of area processing blocks 20 for performing a pattern area calculation are similarly generated in each writing group. It is preferable that dividing is performed such that the amounts of figure data of respective area processing blocks 20 are approximately equal to each other.

In the proximity effect correction processing block generation step (S104), the proximity effect correction processing block generation unit 52 generates a plurality of proximity effect correction processing blocks for correcting a proximity effect, for each writing group region. It is preferable to generate a plurality of proximity effect correction processing blocks 22 of the same size as shown in FIG. 5C.

Moreover, the writing control unit 72 generates a plurality of shot data generation processing blocks 24 for converting writing data to shot data, for each writing group region as shown in FIG. 5D. In parallel to the proximity effect correction calculation, the writing data processing unit 70 henceforth reads writing data of each writing group from the storage device 140, for each shot data generation processing block 24, and performs data conversion processing of a plurality of steps to generate shot data unique to the writing apparatus 100. Hereafter, it will be explained focusing on a proximity effect correction calculation. In the shot data, for example, there are defined a figure code, shot coordinates, a shot figure size, etc. of a figure to be irradiated by one shot.

In the judgment step (S106), the judgment unit 54 judges whether a proximity effect correction dose coefficient $D_p(x)$ at each position for the writing group currently concerned has already been calculated or not. If a pattern having the same writing layout was previously written, or if a calculation was previously performed for a region included in both the previous writing group for the previous calculation and the current writing group for the current calculation, it is preferable that the proximity effect correction dose coefficient $D_p(x)$ obtained at that time has been stored in the storage device 144, for example. If the calculation has already been performed, it goes to the stored data read step (S108). If the calculation has not been performed yet, it goes to the judgment step (S110).

In the stored data read step (S108), when the proximity effect correction dose coefficient $D_p(x)$ at each position for the current writing group has already been calculated, the writing control unit 72 (an example of a read unit) reads the stored data (proximity effect correction dose coefficient $D_p(x)$) from the storage device 144. Then, it goes to the proximity effect correction dose coefficient $D_p(x)$ data map generation step (S122).

In the judgment step (S110), when the proximity effect correction dose coefficient $D_p(x)$ has not been calculated yet, the judgment unit 56 judges whether an area density ρ'(x)

has already been calculated or not. If a pattern having the same writing layout was previously written, or if a calculation was previously performed for a region included in both the previous writing group for the previous calculation and the current writing group for the current calculation, it is preferable that the area density ρ'(x) obtained at that time has been stored in the storage device 144, for example. If the calculation has already been performed, it goes to the stored data read step (S112). If the calculation has not been performed yet, it goes to the area density ρ(x) calculation step (S114). The area density ρ'(x) in this case indicates a value which is weighted by the base dose of a writing group region corresponding to the area density ρ(x) of each area processing block 20, as described later.

In the stored data read step (S112), the writing control unit 72 reads the stored data from the storage device 144 when the area density ρ'(x) has already been calculated. Then, it goes to the area density ρ'(x) data map generation step (S118).

In the area density ρ(x) calculation step (S114), the area density calculation unit 58 calculates an area density ρ(x) of a figure pattern arranged in each area processing block 20. Similarly, with respect to the writing groups 13 and 14, an area density ρ(x) of a figure pattern arranged in each area processing block 20 is calculated. Then, the calculated area density ρ(x) is stored in the storage device 144.

In the weighting calculation step (S116), the weighting calculation unit 60 performs a weighting calculation on an area density ρ(x) by using a base dose $D_{Bi}$ of a corresponding writing group region, for each area processing block 20. i denotes the identifier of a writing group DG. By using this, an area density ρ'(x) on which a weighting calculation has been performed is calculated. For example, it is calculated by $\rho'(x)=D_{Bi}\cdot\rho(x)$. Similarly, with respect to the writing groups 13 and 14, a weighting calculation is performed on an area density ρ(x) by using a base dose $D_{Bi}$ of a corresponding writing group region, for each area processing block 20, and an area density ρ'(x) on which a weighting calculation has been performed is calculated. Then, the calculated area density ρ'(x) is stored in the storage device 144.

In the area density ρ'(x) data map generation step (S118), the area density data map generation unit 62 extracts an area density ρ'(x) of each proximity effect correction processing block 22, and generates an area density ρ'(x) data map for proximity effect correction, by using a weighted area density ρ'(x) which has been obtained for each area processing block 20 of each writing group.

In the proximity effect correction dose coefficient $D_p(x)$ calculation step (S120), the proximity effect correction dose coefficient calculation unit 64 calculates a proximity effect correction dose coefficient $D_p(x)$ for correcting a proximity effect, by using a corresponding weighted area density ρ'(x), for each proximity effect correction processing block 22. According to Embodiment 1, the proximity effect correction dose coefficient calculation unit 64 calculates a proximity effect correction dose coefficient $D_p(x)$ by simultaneously solving dose equations each being for each writing group region. For example, with respect to a region where the writing group 12 (DG1) and the writing group 13 (DG2) are included in the range of the proximity effect, when calculating a proximity effect correction dose coefficient $Dp_i(x)$ for each writing group, the solution is obtained by solving the following equations (1) and (2) as a simultaneous equation.

$$\frac{D_{B(DG1)}D_{p(DG1)}(x)}{2}+\sum_{j=DG1}^{DG2}\eta_j\int g_j(x-x')D_{Bj}D_{pj}(x')p'_j(x')dx'=D_{B(DG1)}\left(\frac{1}{2}+\eta_{DG1}\right) \tag{1}$$

$$\frac{D_{B(DG2)}D_{p(DG2)}(x)}{2}+\sum_{j=DG1}^{DG2}\eta_j\int g_j(x-x')D_{Bj}D_{pj}(x')p'_j(x')dx'=D_{B(DG2)}\left(\frac{1}{2}+\eta_{DG2}\right) \tag{2}$$

In the equation (1), a base dose $D_{B(DG1)}$ and a proximity effect correction coefficient $\eta_{DG1}$ for the writing group 12 (DG1) are used. In the equation (2), a base dose $D_{B(DG2)}$ and a proximity effect correction coefficient $\eta_{DG2}$ for the writing group 13 (DG2) are used. j denotes the identifier (for example, an index) of a writing group. A base dose $D_{Bj}$ and a proximity effect correction coefficient $\eta_j$ of each writing group are read from the storage device 142 respectively. Moreover, a position x indicates a vector.

For solving the simultaneous equation of the equations (1) and (2), a solution which performs the following iteration can be used, for example. Here, for convenience, i denotes the identifier (for example, an index) of a target writing group, and j denotes the identifier (for example, an index) of each writing group which affects the target writing group. The proximity effect correction dose coefficient component $dp_{(1)}(x)$ of the first time (first order) can be obtained by the following equations (3).

$$d_{pi(1)}(x)=\frac{\frac{1}{2}+\eta_i}{\frac{1}{2}+\eta_i\sum_j\frac{\eta_j}{\eta_i}\frac{D_{Bj}}{D_{Bi}}\int g_j(x-x')\rho'_j(x')dx'} \tag{3}$$

The proximity effect correction dose coefficient component $dp_{(n)}(x)$ of the n-th time (n-th order) can be obtained by the following equations (4).

$$d_{pi(n)}(x)=\frac{\eta_i\left\{\begin{array}{l}d_{pi(n-1)}(x)\sum_j\frac{\eta_j}{\eta_i}\frac{D_{Bj}}{D_{Bi}}\int g_j(x-x')\rho'_j(x')dx'-\\ \sum_j\frac{\eta_j}{\eta_i}\frac{D_{Bj}}{D_{Bi}}\int g_j(x-x')d_{pj(n-1)}(x')\rho'_j(x')dx'\end{array}\right\}}{\frac{1}{2}+\eta_i\sum_j\frac{\eta_j}{\eta_i}\frac{D_{Bj}}{D_{Bi}}\int g_j(x-x')\rho'_j(x')dx'} \tag{4}$$

The proximity effect correction dose coefficient $Dp_i(x)$ of the target writing group (i) is the sum of the proximity effect correction dose coefficient components $dp_{(n)}(x)$ up to the required order k, and can be obtained by the following equation (5).

$$D_{pi}(x)=\sum_{n=1}^{k}d_{pi(n)}(x) \tag{5}$$

In actual calculation, what is necessary is to first calculate a proximity effect correction dose coefficient $dp_{(1)}(x)$ of the first time with respect to all the mesh regions in the proximity effect correction processing block 22, and to perform the calculation required iteration number of times "k" repeatedly, such as the second time, the third time, and so on.

As described above, by calculating the proximity effect correction dose coefficient $Dp_i(x)$ by simultaneously solving the dose equation for each related writing group, the proximity effect correction dose coefficient $Dp_i(x)$ taking the pattern of the related writing group into consideration can be obtained. The calculated proximity effect correction dose coefficient $Dp_i(x)$ is stored in the storage device 144.

Although the simultaneous equation (A) of the equations (1) and (2) is used in the example described above, the simultaneous equation is not limited thereto. For example, it is also acceptable to use the simultaneous equation (B) of the following equations (6) and (7).

$$\frac{D_{B(DG1)}D_{p(DG1)}(x)}{2} + \int g_{DG1}(x-x')\sum_{j=DG1}^{DG2}\eta_j D_{Bj}D_{pj}(x')\rho'_j(x')dx' = D_{B(DG1)}\left(\frac{1}{2}+\eta_{DG1}\right) \tag{6}$$

$$\frac{D_{B(DG2)}D_{p(DG2)}(x)}{2} + \int g_{DG2}(x-x')\sum_{j=DG1}^{DG2}\eta_j D_{Bj}D_{pj}(x')\rho'_j(x')dx' = D_{B(DG2)}\left(\frac{1}{2}+\eta_{DG2}\right) \tag{7}$$

For solving the simultaneous equation of the equations (6) and (7), for example, a solution which performs the iteration can be used as described above. The simultaneous equation is not limited thereto. For example, it is also acceptable to use the simultaneous equation (C) of the following equations (8) and (9).

$$\frac{D_{B(DG1)}D_{p(DG1)}(x)}{2} + \eta_{DG1}\int g_{DG1}(x-x')\sum_{j=DG1}^{DG2}D_{Bj}D_{pj}(x')\rho'_j(x')dx' = D_{B(DG1)}\left(\frac{1}{2}+\eta_{DG1}\right) \tag{8}$$

$$\frac{D_{B(DG2)}D_{p(DG2)}(x)}{2} + \eta_{DG2}\int g_{DG2}(x-x')\sum_{j=DG1}^{DG2}D_{Bj}D_{pj}(x')\rho'_j(x')dx' = D_{B(DG2)}\left(\frac{1}{2}+\eta_{DG2}\right) \tag{9}$$

For solving the simultaneous equation of the equations (8) and (9), for example, a solution which performs iteration can be used as described above.

In the proximity effect correction dose coefficient $D_p(x)$ data map generation step (S122), the proximity effect correction dose coefficient data map generation unit 66 extracts a corresponding proximity effect correction dose coefficient $Dp_i(x)$ of each proximity effect correction processing block 22, and generates a proximity effect correction dose coefficient $D_p(x)$ data map.

In the dose D(x) calculation step (S124), the dose calculation unit 68 calculates a dose D(x) of an electron beam by using a base dose $D_{Bi}$ of each writing group region and a proximity effect correction dose coefficient $Dp_i(x)$ of each proximity effect correction processing block. The dose D(x) can be defined by the product of a base dose $D_{Bi}$ and a proximity effect correction dose coefficient $Dp_i(x)$.

In the writing step (S126), under the control of the writing control unit 67, first, the deflection control circuit 130 reads dose D(x) data, irradiates each shot figure with the electron beam 200 of a dose (irradiation time) defined for each shot figure, and calculates a deflection amount for deflecting the electron beam 200 to be blocked when the irradiation time t has passed. Then, a deflection voltage of the calculated deflection amount is applied to a corresponding blanking deflector 212 through the DAC amplifier 132. Moreover, the deflection control circuit 130 calculates a deflection amount for deflecting the electron beam 200 to a defined writing position based on the shot data. Similarly, the deflection control circuit 130 calculates a deflection amount for shaping a figure to be a type and a size defined for each shot figure. Then, a deflection voltage of each deflection amount is applied to corresponding deflectors 205 and 208 through a DAC amplifier (not shown). Under the control of the writing control unit 72, the writing unit 150 writes a figure pattern concerned on the target object 101 by using the electron beam 200 based on the calculated dose D(x), for each writing group DG. Specifically, the following operations are performed.

The electron beam 200 emitted from the electron gun assembly 201 (emission unit), when passing through the blanking deflector 212, is controlled to pass through the blanking aperture 214 by the blanking deflector 212 in the case where the beam is in the ON state, and is deflected by the blanking deflector 212 so that the entire beam may be blocked by the blanking aperture 214 in the case where the beam is in the OFF state. The electron beam 200, passing through the blanking aperture 214 while changing the state from beam OFF to beam ON and lastly again to beam OFF, serves as one shot of the electron beam. The blanking deflector 212 controls the direction of the passing electron beam 200 to alternately generate the beam ON state and the beam OFF state. For example, it is acceptable to apply a voltage to the blanking deflector 212 when in the beam. OFF state and not to apply a voltage when in the beam ON state. The dose per shot of the electron beam 200 to irradiate the target object 101 is adjusted depending upon an irradiation time t of each shot.

As described above, each shot of the electron beam 200, which is generated by passing through the blanking deflector 212 and the blanking aperture 214, irradiates the whole of the first shaping aperture 203 having a quadrangular opening by the illumination lens 202. Here, the electron beam 200 is first shaped to be a quadrangle. Then, after having passed through the first shaping aperture 203, the electron beam 200 of a first aperture image is projected onto the second shaping aperture 206 by the projection lens 204. The first aperture image on the second shaping aperture 206 is deflection-controlled by the deflector 205 so as to change (variably shape) the shape and size of the beam. Such variable beam shaping is performed for each shot, and, usually, each of the shots is shaped to have a different shape and size. Then, after having passed through the second shaping aperture 206, the electron beam 200 of a second aperture image is focused by the objective lens 207, and deflected by the deflector 208 to reach a desired position on the target object 101 placed on the XY stage 105 which moves continuously. Since the XY stage 105 is moving, the deflector 208 deflects the electron beam 200 such that it follows the movement of the XY stage 105.

According to Embodiment 1, as described above, when writing patterns of different writing conditions, it is possible to perform proximity effect correction while taking the influence of both the patterns into consideration. Accordingly, highly accurate writing can be performed even when patterns of different writing conditions (patterns of a plurality of writing groups) are written.

Since proximity effect correction is performed in real time while performing writing, the method conventionally employed is to throw away, after using, calculated data concerning a pattern area necessary for the correction calculation without continuously storing it in order to reduce the load to the memory even if temporarily performing storing. Therefore, according to the conventional method, when performing proximity effect correction for each of patterns of different writing conditions, an area calculation needs to be performed a plurality of times for the same region, thereby there occurs a problem in that the calculation time becomes much longer. However, according to Embodiment 1, by storing in the storage device 144 pattern area densities $\rho(x)$, $\rho'(x)$, etc. which are necessary for the correction calculation, such densities can be used again. Consequently, it is not necessary to calculate such densities etc. each time, thereby reducing the operation time.

Embodiment 2

Although the proximity effect correction dose coefficient $Dp_i(x)$ is calculated by simultaneously solving a dose equation for each related writing group according to Embodiment 1, the method of performing proximity effect correction considering the influence of patterns of different writing conditions is not limited thereto. Another method will be described in Embodiment 2. The structure of the writing apparatus 100 is the same as that of FIG. 1, and the flowchart of each step of the writing method is the same as that of FIG. 4. Moreover, the content of Embodiment 2 is the same as that of Embodiment 1 except what is described below.

In the area processing block generation step (S102), the area processing block generation unit 50 (block generation unit) generates a plurality of area processing blocks in the writing region 10 that includes each region of a plurality of writing groups respectively having different base doses $D_B$ and different proximity effect correction coefficients $\eta$, in each of which a plurality of figure patterns are arranged.

FIGS. 6A to 6D are schematic diagrams each showing an example of a processing block according to Embodiment 2. Similarly to FIGS. 2 and 5A, FIG. 6A shows the case where a plurality of writing groups 12, 13, and 14 are arranged (written) in the writing region 10 of the target object 101. According to Embodiment 2, the area processing block generation unit 50 generates a plurality of area processing blocks 20 by dividing the writing region 10, where a plurality of writing group regions are included, regardless of writing group region as shown in FIG. 6B. Here, it is preferable that dividing is performed such that the amounts of figure data of respective area processing blocks 20 are approximately equal to each other.

Moreover, each of the steps from the proximity effect correction processing block generation step (S104) to the stored data read step (S112) is the same as that of Embodiment 1. Here, as shown in FIG. 6C, it is preferable that a plurality of proximity effect correction processing blocks 22 each having the same size as that of FIG. 5C are generated in each writing group region. Moreover, as shown in FIG. 6D, a plurality of shot data generation processing blocks 24 are generated in each writing group region similarly to FIG. 5D.

In the area density $\rho(x)$ calculation step (S114), the area density calculation unit 58 calculates an area density $\rho(x)$ of each area processing block 20 which was generated by performing dividing regardless of writing group. Hereafter, each of the steps from the weighting calculation step (S116) to the area density $\rho'(x)$ data map generation step (S118) is the same as that of Embodiment 1.

In the proximity effect correction dose coefficient $D_p(x)$ calculation step (S120), the proximity effect correction dose coefficient calculation unit 64 calculates a proximity effect correction dose coefficient $D_p(x)$ for correcting a proximity effect, by using a corresponding weighted area density $\rho'(x)$, for each proximity effect correction processing block 22. According to Embodiment 2, the proximity effect correction dose coefficient calculation unit 64 calculates a proximity effect correction dose coefficient $D_p(x)$ by solving a dose equation for each writing group region. For example, when calculating a proximity effect correction dose coefficient $Dp_i(x)$ of a target writing group (i), the solution can be obtained by solving an equation (D) shown by the following equation (10) considering the influence of the writing group (j) included in the range of the proximity effect.

$$\frac{D_{Bi}D_{pi}(x)}{2} + \int g_i(x-x')D_{pi}(x')\sum_{j=DG1}^{DG2}\eta_j D_{Bj}\rho'_j(x')dx' = D_{Bi}\left(\frac{1}{2}+\eta_i\right) \tag{10}$$

For solving the equation (D) of the equation (10), for example, a solution which performs iteration can be used as described above. The equation according to Embodiment 2 is not limited thereto. For example, it is also acceptable to use an equation (E) defined by the following equation (11).

$$\frac{D_{Bi}D_{pi}(x)}{2} + \eta_i\int g_i(x-x')D_{pi}(x')\sum_{j=DG1}^{DG2}D_{Bj}\rho'_j(x')dx' = D_{Bi}\left(\frac{1}{2}+\eta_i\right) \tag{11}$$

For solving the equation (E) of the equation (11), for example, a solution which performs iteration can be used as described above.

As described above, it is possible to obtain a proximity effect correction dose coefficient $Dp_i(x)$ taking a pattern of a related writing group into consideration, by solving the equation which suitably uses the base dose $D_{Bj}$, the proximity effect correction coefficient $\eta_j$, and the area density $\rho'_j(x)$ of the related writing group. The calculated proximity effect correction dose coefficient $Dp_i(x)$ is stored in the storage device 144.

According to Embodiment 2, as described above, when writing patterns of different writing conditions, it is possible to perform proximity effect correction while taking the influence of both the patterns into consideration. Accordingly, highly accurate writing can be performed even when patterns of different writing conditions (patterns of a plurality of writing groups) are written.

Since proximity effect correction is performed in real time while performing writing, the method conventionally employed is to throw away, after using, calculated data concerning a pattern area necessary for the correction calculation without continuously storing it in order to reduce the load to the memory even if temporarily performing storing. Therefore, according to the conventional method, when performing proximity effect correction for each of patterns of different writing conditions, an area calculation needs to be performed a plurality of times for the same region, thereby there occurs a problem in that the calculation time becomes much longer. However, according to Embodiment 2, by storing in the storage device 144 pattern area densities ρ(x), ρ'(x), etc. which are necessary for the correction calculation, such densities can be used again. Consequently, it is not necessary to calculate such densities etc. each time, thereby reducing the operation time.

Figure 7:
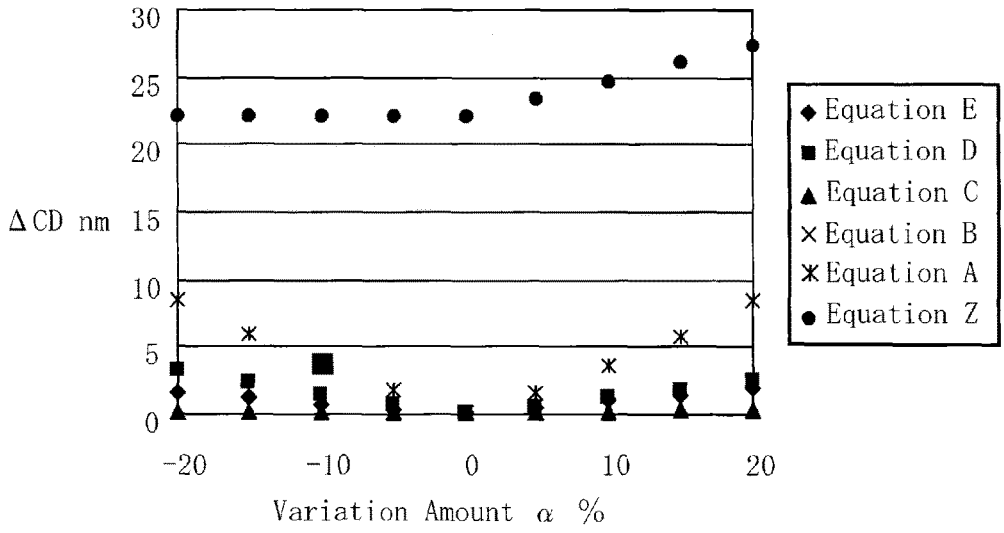
FIG. 7 is a graph showing an example of the accuracy of correction according to Embodiments 1 and 2.

FIG. 7 is a graph showing an example of the accuracy of correction according to Embodiments 1 and 2. In FIG. 7, first, an equation (Z) not considering a related writing group is shown in the following equation (12), as a comparative example.

$$\frac{D_{Bi}D_{pi}(x)}{2} + \eta_i \int g_i(x - x')D_{Bi}D_{pi}(x')\rho'_j(x')dx' = D_{Bi}\left(\frac{1}{2} + \eta_i\right) \quad (12)$$

It can be known from FIG. 7 that the proximity effect correction error LCD is large when using the equation (Z) which does not take a related writing group into consideration. On the other hand, when using the simultaneous equations (A) to (C) described in Embodiment 1 and the equations (D) to (E) described in Embodiment 2, the proximity effect correction error ΔCD is much smaller compared with the comparative example. Thus, according to Embodiments 1 and 2, proximity effect correction can be performed with high accuracy.

Embodiment 3

In Embodiments 1 and 2, the base dose $D_B$, the proximity effect correction coefficient η, etc. have been respectively stored in the storage device 142 in advance for each writing group.

However, according to Embodiment 3, a base dose $D_{B0}$ and a proximity effect correction coefficient $\eta_0$ which are common regardless of writing group, and a dose modulation coefficient $\alpha_i$ of each writing group are used.

Figure 8:
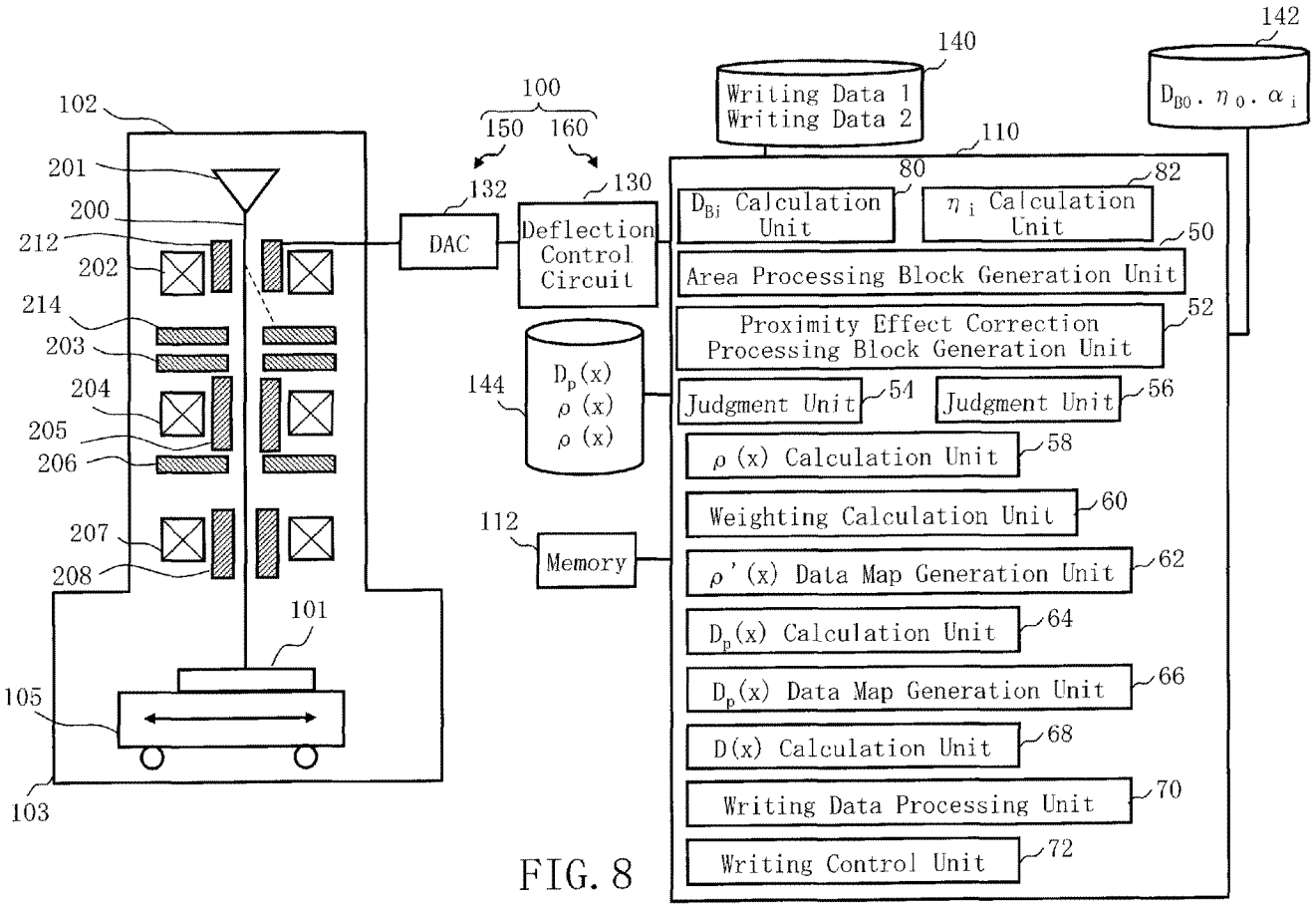
FIG. 8 is a block diagram showing a structure of a writing apparatus according to Embodiment 3.

FIG. 8 is a block diagram showing a structure of a writing apparatus according to Embodiment 3. FIG. 8 is the same as FIG. 1 except that a base dose calculation unit 80 and a proximity effect correction coefficient calculation unit 82 are further arranged in the control computer 110, and that a base dose $D_{B0}$ and a proximity effect correction coefficient $\eta_n$ which are common regardless of writing group, and a dose modulation coefficient $\alpha_i$ of each writing group are input from the outside to be stored in the storage device 142. Each function of the area processing block generation unit 50, the proximity effect correction processing block generation unit 52, the judgment units 54 and 56, the area density calculation unit 58, the weighting calculation unit 60, the area density data map generation unit 62, the dose coefficient calculation unit 64 for proximity effect correction, the dose coefficient data map generation unit 66 for proximity effect correction, the dose calculation unit 68, the writing data processing unit 70, the writing control unit 72, the base dose calculation unit 80, and the proximity effect correction coefficient calculation unit 82 may be implemented by a software program, or configured by hardware, such as an electronic circuit. Alternatively, it may be implemented by a combination of software and hardware. Input data necessary for such functions or a calculated result is stored in the memory 112 each time.

The content of Embodiment 3 is the same as that of Embodiment 1 or 2 except what is described below.

According to Embodiment 3, a base dose $D_{Bi}$ and a proximity effect correction coefficient $\eta_i$ for each writing group are obtained by calculation in the writing apparatus 100.

First, in the base dose $D_{Bi}$ calculation step, the base dose calculation unit 80 reads a base dose $D_{B0}$ and a dose modulation coefficient $\alpha_i$ for each writing group from the storage device 142, and calculates a base dose $D_{Bi}$ for each writing group. For example, a base dose $D_{Bi}$ can be defined by $D_{Bi}=D_{B0}\cdot\alpha_i$.

Next, in the proximity effect correction coefficient $\eta_i$ calculation step, the proximity effect correction coefficient calculation unit 82 reads a base dose $D_{B0}$ and a proximity effect correction coefficient $\eta_0$ from the storage device 142, and calculates a proximity effect correction coefficient $\eta_i$ for each writing group by using the base dose $D_{B0}$, the proximity effect correction coefficient $\eta_0$, and the base dose $D_{Bi}$ which has been calculated previously for each writing group. The proximity effect correction coefficient $\eta_i$ can be defined by the following equation (13), for example.

$$\eta_i = \frac{\eta_0 D_{Bi}}{(1 + 2\eta_0)D_{B0} - 2\eta_0 D_{Bi}} \quad (13)$$

Each step after the area processing block generation step (S102) is executed by using the base dose $D_{Bi}$ and the proximity effect correction coefficient $\eta_i$ of each writing group which have been obtained as described above. The content of each step after the area processing block generation step (S102) is the same as that of Embodiment 1 or 2.

As described above, when writing patterns of different writing conditions, even in the case of using a base dose $D_{B0}$ and a proximity effect correction coefficient $\eta_0$ which are common regardless of writing group and a dose modulation coefficient $\alpha_i$ of each writing group, it is possible to perform proximity effect correction while taking the influence of both the patterns into consideration. Accordingly, highly accurate writing can be performed even when patterns of different writing conditions (patterns of a plurality of writing groups) are written.

Embodiment 4

Although, in Embodiment 3, a base dose $D_{Bi}$ and a proximity effect correction coefficient $\eta_i$ for each writing group are calculated by using a base dose $D_{B0}$ and a proximity effect correction coefficient $\eta_0$ which are common regardless of writing group and a dose modulation coefficient $\alpha_i$ of each writing group, it is not limited thereto. According to Embodiment 4, there will be described a case of using a base dose $D_{BC}$ and a proximity effect correction coefficient $\eta_0$ which are common regardless of writing group, a resizing amount $R_i$ for each writing group, and correlation data.

Figure 9:
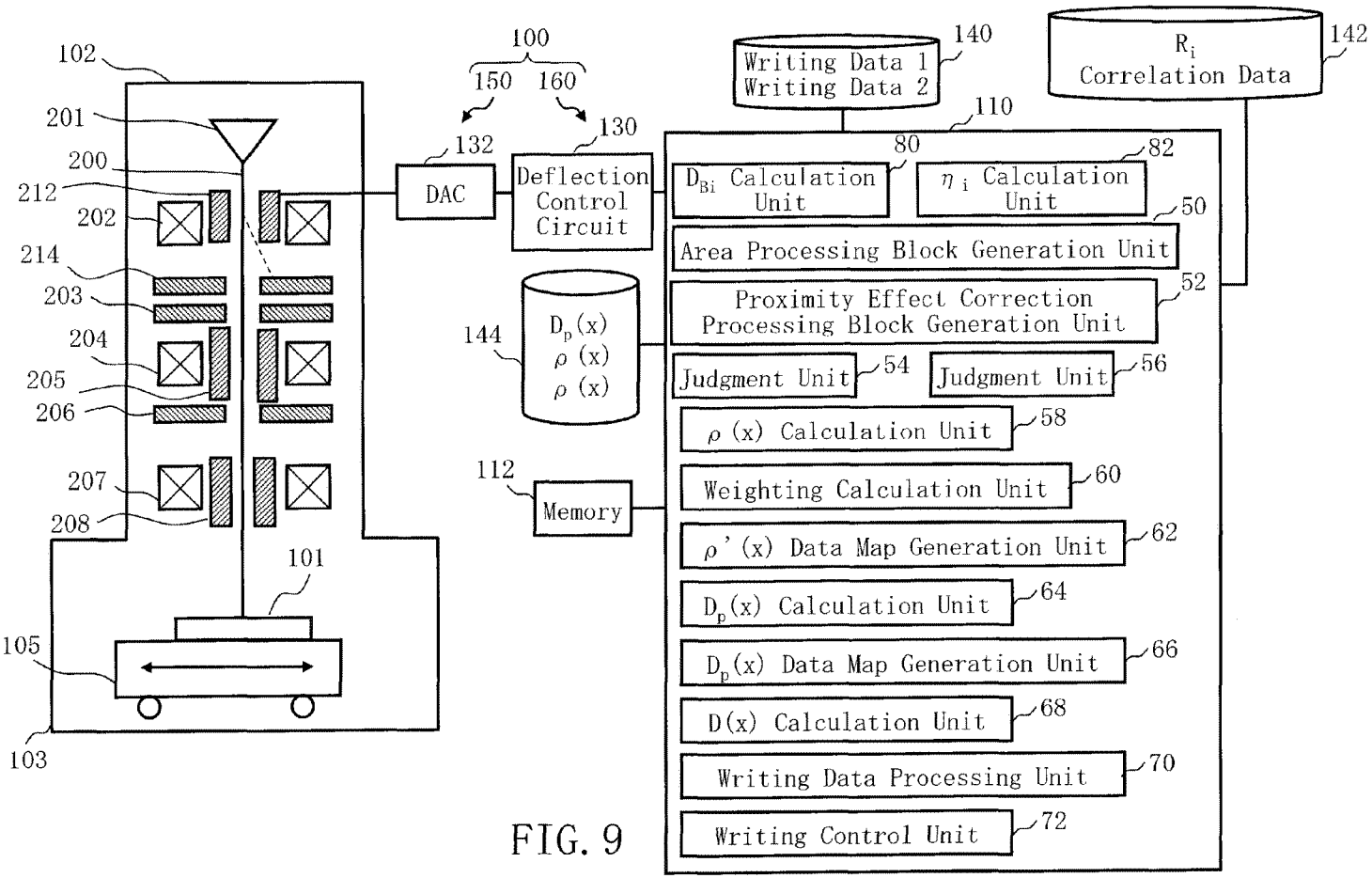
FIG. 9 is a block diagram showing a structure of a writing apparatus according to Embodiment 4.
Figure 10:
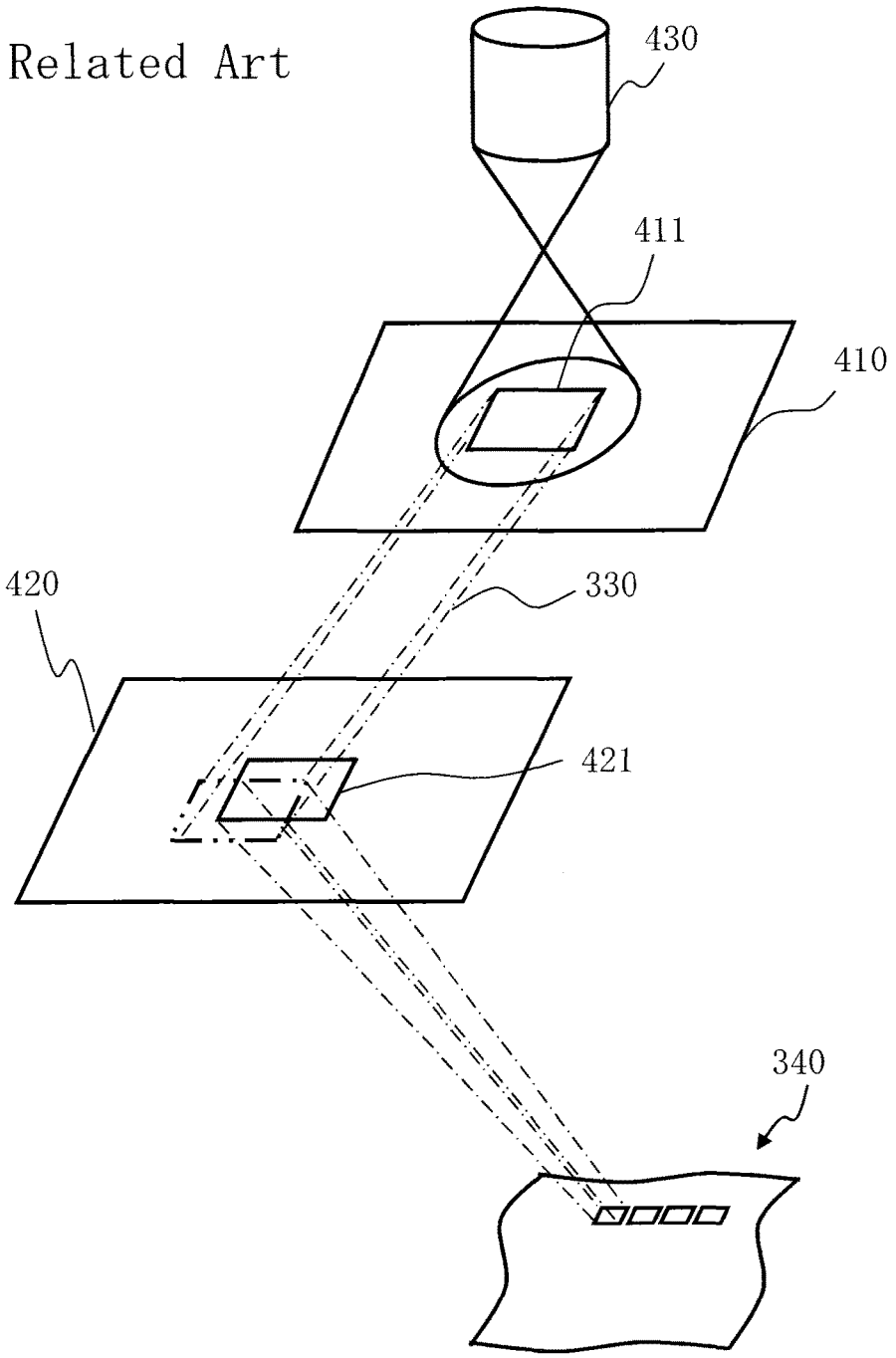
FIG. 10 is a schematic diagram explaining operations of a variable shaped electron beam writing apparatus.

FIG. 9 is a block diagram showing a structure of a writing apparatus according to Embodiment 4. FIG. 9 is the same as FIG. 8 except that a resizing amount $R_i$ for each writing group and correlation data are input from the outside to be stored in the storage device 142. The correlation data indicates a correlation between an optimal base dose for a resizing amount and an optimal proximity effect correction coefficient for the resizing amount. The content of Embodiment 4 is the same as that of Embodiment 3 except what is described below.

First, in the base dose $D_{Bi}$ calculation step, the base dose calculation unit 80 reads a resizing amount $R_i$ of each writing group and correlation data from the storage device 142, and calculates an optimal base dose corresponding to a resizing amount $R_i$ of each writing group, as a base dose $D_{Bi}$.

Next, in the proximity effect correction coefficient $\eta_i$ calculation step, the proximity effect correction coefficient calculation unit 82 calculates an optimal proximity effect correction coefficient corresponding to a resizing amount $R_i$ of each writing group, as a proximity effect correction coefficient $\eta_i$.

Each step after the area processing block generation step (S102) is executed by using the base dose $D_{Bi}$ and the proximity effect correction coefficient $\eta_i$ of each writing group which have been obtained as described above. The content of each step after the area processing block generation step (S102) is the same as that of Embodiment 1 or 2.

Embodiments have been explained referring to concrete examples described above. However, the present invention is not limited to these specific examples.

While the apparatus configuration, control method, etc. not directly necessary for explaining the present invention are not described, some or all of them may be suitably selected and used when needed. For example, although description of the configuration of a control unit for controlling the writing apparatus 100 is omitted, it should be understood that some or all of the configuration of the control unit is to be selected and used appropriately when necessary.

In addition, any other charged particle beam writing apparatus and a method thereof that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus comprising:

a first block generation unit configured to generate a plurality of area processing blocks in a writing region in which a plurality of writing groups respectively using different one of base doses set in advance, where a plurality of figure patterns are arranged in each of regions of the plurality of writing groups, is to be written;

a second block generation unit configured to generate a plurality of proximity effect correction processing blocks for proximity effect correction, in the each of the regions of the plurality of writing groups;

an area density calculation unit configured to calculate an area density of a figure pattern arranged in each of the plurality of area processing blocks;

a weighting calculation unit configured to perform a weighting calculation on the area density for each of the plurality of area processing blocks by using a base dose of a corresponding group in the plurality of writing groups;

a proximity effect correction dose coefficient calculation unit configured to calculate a proximity effect correction dose coefficient for proximity effect correction, for each of the plurality of proximity effect correction processing blocks, by using a corresponding weighted area density;

a dose calculation unit configured to calculate a dose of a charged particle beam by using the base dose of the each of the plurality of writing groups and the proximity effect correction dose coefficient, calculated using the corresponding weighted area density weighted by the base dose, of the each of the plurality of proximity effect correction processing blocks; and a writing unit configured to write a figure pattern concerned in the plurality of figure patterns on a target object with a charged particle beam, based on the dose calculated, for the each of the regions of the plurality of writing groups.

2. The apparatus according to claim 1, wherein the writing region includes the regions of the plurality of writing groups, and the first block generation unit generates the plurality of area processing blocks by dividing the writing region regardless of the regions of the plurality of writing groups, and the area density calculation unit calculates the area density for each of the plurality of area processing blocks generated by being divided regardless of the regions of the plurality of writing groups.

3. The apparatus according to claim 2, further comprising:

a proximity effect correction coefficient calculation unit configured to calculate a proximity effect correction coefficient for the each of the regions of the plurality of writing groups by using a base dose and a proximity effect correction coefficient which were set regardless of the regions of the plurality of writing groups, and a base dose of the each of the plurality of writing groups.

4. The apparatus according to claim 1, wherein the proximity effect correction dose coefficient calculation unit calculates the proximity effect correction dose coefficient by simultaneously solving dose equations each being for the each of the regions of the plurality of writing groups.

5. The apparatus according to claim 1, further comprising:

a *first* judgment unit configured to judge whether a proximity effect correction dose coefficient at each position for a writing group currently concerned in the plurality of writing groups has already been calculated.

6. The apparatus according to claim 5, further comprising:

a storage device configured to store the proximity effect correction dose coefficient; and a read unit configured, in a case that the proximity effect correction dose coefficient at the each position for the writing group currently concerned in the plurality of writing groups has already been calculated, to read the proximity effect correction dose coefficient from the storage device.

7. The apparatus according to claim 5, further comprising:

a *second* judgment unit configured to judge, in a case that the proximity effect correction dose coefficient has not yet been calculated, whether the area density has already been calculated.

8. A charged particle beam writing method comprising:

generating a plurality of area processing blocks in a writing region in which a plurality of writing groups respectively using different one of base doses set in advance, where a plurality of figure patterns are arranged in each of regions of the plurality of writing groups, is to be written;

generating a plurality of proximity effect correction processing blocks for proximity effect correction, in the each of the regions of the plurality of writing groups;

calculating an area density of a figure pattern arranged in each of the plurality of area processing blocks;

performing a weighting calculation on the area density for each of the plurality of area processing blocks by using a base dose of a corresponding group in the plurality of writing groups;

calculating a proximity effect correction dose coefficient for proximity effect correction, for each of the plurality of proximity effect correction processing blocks, by using a corresponding weighted area density;

calculating a dose of a charged particle beam by using the base dose of the each of the plurality of writing groups and the proximity effect correction dose coefficient, calculated using the corresponding weighted area density weighted by the base dose, of the each of the plurality of proximity effect correction processing blocks; and writing a figure pattern concerned in the plurality of figure patterns on a target object with a charged particle beam, based on the dose calculated, for the each of the regions of the plurality of writing groups.

9. The method according to claim 8, wherein the writing region includes the regions of the plurality of writing groups, and the plurality of area processing blocks are generated by dividing the writing region regardless of the regions of the plurality of writing groups, and the area density is calculated for each of the plurality of area processing blocks generated by performing the dividing regardless of the regions of the plurality of writing groups.

10. The method according to claim 9, further comprising:

calculating a proximity effect correction coefficient for the each of the regions of the plurality of writing groups by using a base dose and a proximity effect correction coefficient which were set regardless of the regions of the plurality of writing groups, and a base dose of the each of the regions of the plurality of writing groups.

11. The method according to claim 8, wherein the proximity effect correction dose coefficient is calculated by simultaneously solving dose equations each being for the each of the regions of the plurality of writing groups.

12. The method according to claim 8, further comprising:

judging whether a proximity effect correction dose coefficient at each position for a writing group currently concerned in the plurality of writing groups has already been calculated.

13. The method according to claim 12, further comprising:

reading, in a case that the proximity effect correction dose coefficient at the each position for the writing group currently concerned in the plurality of writing groups has already been calculated, the proximity effect correction dose coefficient having been calculated from a storage device that stores the proximity effect correction dose coefficient having been calculated.

14. The method according to claim 12, further comprising:

judging, in a case that the proximity effect correction dose coefficient has not yet been calculated, whether the area density has already been calculated.

*15. A charged particle beam writing apparatus comprising:*

*a first block generation unit configured by a circuit or a computer, to generate a plurality of area processing blocks in a writing region in which a plurality of writing groups respectively using a dose modulation coefficient set in advance for acquiring a base dose, where a plurality of figure patterns are arranged in each of regions of the plurality of writing groups, is to be written;*

*a second block generation unit configured by a circuit or the computer, to generate a plurality of proximity effect correction processing blocks for proximity effect correction, in the writing region;*

*an area density calculation unit configured by a circuit or the computer, to calculate an area density of a figure pattern arranged for each of the plurality of area processing blocks;*

*a proximity effect correction dose coefficient calculation unit configured by a circuit or the computer, to calculate a proximity effect correction dose coefficient for proximity effect correction, for each of the plurality of proximity effect correction processing blocks, by using an area density and a base dose based on the dose modulation coefficient for a corresponding group of the plurality of writing groups;*

*a dose calculation unit configured by a circuit or the computer, to calculate a dose of a charged particle beam by using the base dose of each of the plurality of writing groups, the base dose being based on the close modulation coefficient, and the proximity effect correction dose coefficient of the each of the plurality of proximity effect correction processing blocks; and*

*a writing mechanism including a charged particle beam source, a deflector and a stage placing a target object thereon, configured to write a figure pattern concerned in the plurality of figure patterns on the target object with a charged particle beam, based on the dose calculated, for the each of the plurality of writing groups.*

*16. The apparatus according to claim 15, wherein the proximity effect correction dose coefficient for a target writing group is corrected for using information of an adjacent writing group of the target writing group, the adjacent writing group being written by using writing conditions different from writing conditions of the target writing group.*

*17. The apparatus according to claim 15, further comprising:*

*a base dose calculation unit configured by a circuit or the computer, to calculate the base dose for a target writing group of the plurality of writing groups by using a dose modulation coefficient for the target writing group, the dose modulation coefficient modulating a dose.*

*18. A charged particle beam writing method comprising:*

*generating a plurality of area processing blocks in a writing region in which a plurality of writing groups respectively using one of a dose modulation coefficient and a resizing amount set in advance for acquiring a base dose, where a plurality of figure patterns are arranged in each of regions of the plurality of writing groups, is to be written;*

*generating a plurality of proximity effect correction processing blocks for proximity effect correction, in the writing region;*

*calculating an area density of a figure pattern arranged for each of the plurality of area processing blocks;*

*calculating a proximity effect correction dose coefficient for proximity effect correction, for each of the plurality of proximity effect correction processing blocks, by using an area density and a base dose based on the one of the dose modulation coefficient and the resizing amount for a corresponding group of the plurality of writing groups;*

*calculating a dose of a charged particle beam by using the base dose of each of the plurality of writing groups, the base dose being based on the one of the dose modulation coefficient and the resizing amount, and the proximity effect correction dose coefficient of the each of the plurality of proximity effect correction processing blocks; and*

*writing a figure pattern concerned in the plurality of figure patterns on a target object with a charged particle beam, based on the dose calculated, for the each of the plurality of writing groups.*

*19. The method according to claim 18, wherein the proximity effect correction dose coefficient for a target writing group is corrected for using information of an adjacent writing group of the target writing group, the adjacent writing group being written by using writing conditions different from writing conditions of the target writing group.*

*20. A charged particle beam writing apparatus comprising:*

*a first block generation unit configured by a circuit or a computer, to generate a plurality of area processing blocks in a writing region in which a plurality of writing groups respectively using a dose modulation coefficient set in advance for acquiring a base dose, where a plurality of figure patterns are arranged in each of regions of the plurality of writing groups, is to be written;*

*a second block generation unit configured by a circuit or the computer, to generate a plurality of proximity effect correction processing blocks for proximity effect correction, in the writing region;*

*an area density calculation unit configured by a circuit or the computer, to calculate an area density of a figure pattern arranged for each of the plurality of area processing blocks;*

*a weighting calculation unit configured to perform a weighting calculation on the area density for each of the plurality of area processing blocks by using a base dose, based on the dose modulation coefficient, of a corresponding group in the plurality of writing groups;*

*a proximity effect correction dose coefficient calculation unit configured to calculate a proximity effect correction dose coefficient for proximity effect correction, for each of the plurality of proximity effect correction processing blocks, by using a corresponding weighted area density;*

*a dose calculation unit configured to calculate a dose of a charged particle beam by using the base dose of the each of the plurality of writing groups and the proximity affect correction dose coefficient, calculated using the corresponding weighted area density weighted by the base dose, of the each of the plurality of proximity effect correction processing blocks; and*

*a writing mechanism including a charged particle beam source, a deflector and a stage placing a target object thereon, configured to write a figure pattern concerned in the plurality of figure patterns on the target object with a charged particle beam, based on the dose calculated, for the each of the plurality of writing groups.*

*21. A charged particle beam writing method comprising:*

*generating a plurality of area processing blocks in a writing region in which a plurality of writing groups respectively using one of a dose modulation coefficient and a resizing amount set in advance for acquiring a base dose, where a plurality of figure patterns are arranged in each of regions of the plurality of writing groups, is to be written;*

*generating a plurality of proximity effect correction processing blocks for proximity effect correction, in the each of the regions of the plurality of writing groups;*

*calculating an area density of a figure pattern arranged in each of the plurality of area processing blocks;*

*performing a weighting calculation on the area density for each of the plurality of area processing blocks by using a base dose, based on the one of the dose modulation coefficient and the resizing amount, of a corresponding group in the plurality of writing groups;*

*calculating a proximity effect correction dose coefficient for proximity affect correction, for each of the plurality of proximity effect correction processing blocks, by using a corresponding weighted area density;*

*calculating a dose of a charged particle beam by using the base dose of the each of the plurality of writing groups and the proximity effect correction dose coefficient, calculated using the corresponding weighted area density weighted by the base dose, of the each of the plurality of proximity effect correction processing blocks; and*

*writing a figure pattern concerned in the plurality of figure patterns on a target object with a charged particle beam, based on the dose calculated, for the each of the regions of the plurality of writing groups.*

* * * * *